United States Patent [19]

Dworsky et al.

[11] 4,232,239
[45] Nov. 4, 1980

[54] FREQUENCY ADJUSTMENT OF PIEZOELECTRIC RESONATOR UTILIZING LOW ENERGY OXYGEN GLOW DEVICE FOR ANODIZING ELECTRODES

[75] Inventors: Lawrence N. Dworsky, Coral Springs; Jeffery A. Whalin, Hialeah; Warren P. Glotzbach, Tamarac, all of Fla.

[73] Assignee: Motorola, Inc., Schaumburg, Ill.

[21] Appl. No.: 20,909

[22] Filed: Mar. 16, 1979

[51] Int. Cl.³ ............................................ H01L 41/22
[52] U.S. Cl. ................................. 310/312; 29/25.35; 29/593; 204/164; 427/100
[58] Field of Search ............... 310/312, 320, 364, 365, 310/366; 333/191; 29/25.35, 593; 427/100; 324/56; 314/130, 133; 204/164

[56] References Cited
U.S. PATENT DOCUMENTS 4,130,771  12/1978  Bottom .................................. 310/312

Primary Examiner—Mark O. Budd
Attorney, Agent, or Firm—Donald B. Southard; James W. Gillman

[57] ABSTRACT

A monolithic crystal filter formed by a multi-section piezoelectric resonator having anodizable electrodes is subjected to plasma from a low energy oxygen glow device to adjust the frequency response. The electrodes are selectively connected to potentials whereby the electrodes are individually anodized to increase the density thereof and change the frequency response of the resonator. The glow device includes anode and cathode rings separated by an insulator ring which holds a cathode screen across the cathode. The anode ring has a concave face and the inside diameter is generally the same as the diameter of the resonator so that the resonator can be placed close to the anode and plasma is localized on the resonator electrodes. The electrodes are connected in a frequency measuring circuit so that the response is monitored and the extent of anodization of the individual electrodes is controlled.

10 Claims, 5 Drawing Figures

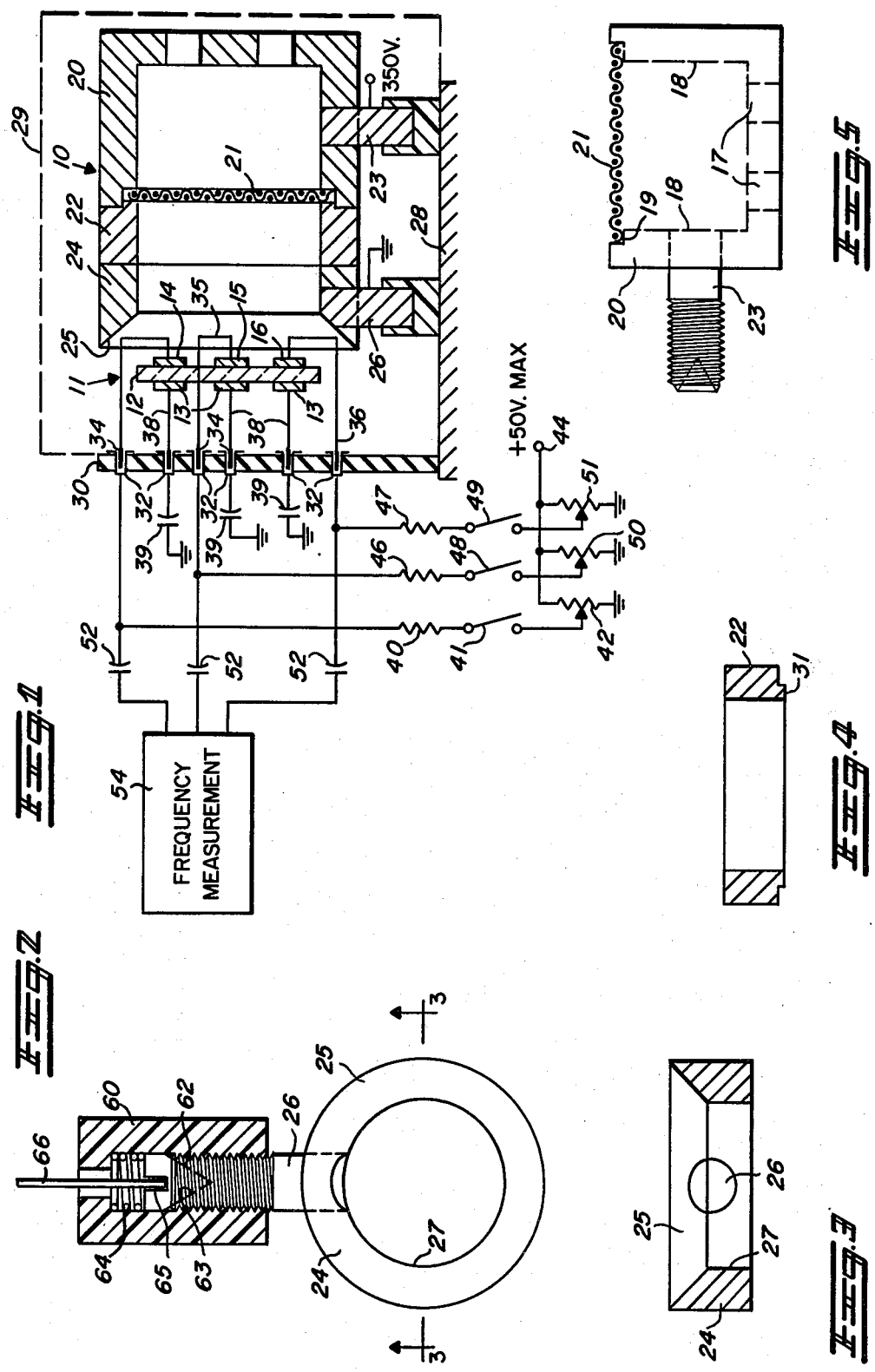

FREQUENCY ADJUSTMENT OF PIEZOELECTRIC RESONATOR UTILIZING LOW ENERGY OXYGEN GLOW DEVICE FOR ANODIZING ELECTRODES

BACKGROUND OF THE INVENTION

Piezoelectric resonators are used for accurate frequency response and control in many applications, such as for monolithic filters used in radio apparatus. Monolithic crystal filters include a flat quartz wafer having an array of thin film electrodes deposited on each side thereof. The frequency response of such resonators depends upon the thickness of the quartz wafer and the thickness of the electrodes. It is not possible using presently known, low cost, manufacturing techniques to provide the degree of accuracy required in many applications. It has been proposed to modify the characteristics of crystal filters by the use of external devices, but this increases the cost and size of the apparatus and has not been generally satisfactory.

For use at frequencies in the VHF range, the electrodes for the crystal resonators are commonly formed of aluminum. It is known that the mass of aluminum electrodes can be adjusted by anodically growing an oxide thereon. However, a satisfactory method of implementing such anodization has not been known. A liquid anodizing bath has been used, but this has the disadvantage that the resonator must be rinsed and dried before testing, and repeated operations may be required to provide the desired frequency response. It is also known that anodization can be accomplished by use of oxygen plasma produced by a glow discharge, but as it has not been possible to localize this action, high energy plasma must be used. This produces substantial heat so that errors in measurements tend to result, and damage to the crystal and electrodes may take place.

SUMMARY OF THE INVENTION

It is an object of the present invention to provide a simple and effective process for adjustment of a piezoelectric resonator by anodizing the electrodes thereof.

Another object of this invention is to provide a process for selective anodization of individual electrodes of a monolithic crystal filter, to thereby adjust the overall frequency response of the filter.

A further object is to provide a process for selective anodization of a plurality of electrodes, wherein the frequency response is monitored during anodization, and potentials are selectively applied to the electrodes to individually control the anodization thereof in response to the measurements obtained.

A still further object is to provide a process utilizing a low energy oxygen glow device for directing plasma to a localized region to anodize electrodes of a piezoelectric resonator in a dry atmosphere without producing substantial heat.

Still another object is to provide a process and apparatus for selectively anodizing electrodes of a resonator which does not contaminate or otherwise damage the same.

In accordance with the invention, the frequency response of a monolithic crystal filter, or other multisection piezoelectric resonator, is adjusted by selectively anodizing the electrodes to increase their mass or effective thickness. A low energy oxygen glow device applies plasma in a localized area adjacent the electrodes, and the electrodes are selectively connected to potentials to control the anodization action thereon. The frequency response of the filter is monitored during the anodization operation, and the measurements obtained are used to control the extent of the anodization of the individual electrodes. For use with aluminum electrodes, the glow device can also be made of aluminum so that there will be no material sputtered from the device which might contaminate the resonator. The glow device includes small anode and cathode rings separated by an anodized ring insulator which holds a cathode screen against the cathode ring. This device can be easily and inexpensively made of aluminum. The anode has a concave annular end adjacent the resonator to direct plasma on the electrodes, so that the low energy glow device provides effective anodization of electrodes which are connected in a current path. This process produces very little heat and permits continuous monitoring of the frequency response of the resonator so that anodization of the individual electrodes can be controlled to provide the desired frequency response.

BRIEF DESCRIPTION OF THE DRAWINGS

FIG. 1 illustrates the anodization process of the invention and the apparatus used in the process;

FIG. 2 is a view, partly in cross-section, showing the anode of the glow device;

FIG. 3 is a cross-sectional view along the lines 3—3 of FIG. 2;

FIG. 4 shows the insulator of the glow device; and

FIG. 5 shows the cathode of the glow device.

DETAILED DESCRIPTION OF A PREFERRED EMBODIMENT

FIG. 1 shows an oxygen glow device or gun 10 for applying oxygen plasma to the electrodes 14, 15 and 16 of piezoelectric resonator device 11, which may be a monolithic crystal filter. The electrodes 14, 15 and 16 are positioned on one side of wafer 12 of piezoelectric material, such as quartz, with cooperating electrodes 13 on the opposite side to form three resonating sections coupled through the wafer 12. The gun 10 includes an annular cathode 20 having a screen 21 across the open end. An annular anode 24 is at the opposite end of the gun 10, with an insulating ring 22 interposed between the anode and cathode. The cathode 20, ring 22 and anode 24 may all be formed of aluminum, with the surfaces of ring 22 being anodized to render the same non-conductive, and certain of the surfaces of cathode 20 and anode 24 also being anodized, as will be explained. The screen 21 can be formed of a fine mesh stainless steel.

To provide an oxygen glow at the anode 24 of the gun 10, the anode 24 is held at a positive potential with respect to the cathode 20, with a potential of the order of 350 volts being found to be suitable. The anode 24 has a concave or tapered end surface 25 adjacent to the piezoelectric device 11 and acts to direct the plasma onto the electrodes 14, 15 and 16. It is pointed out that the piezoelectric device 11 can have any number of electrodes thereon, more or less than the three electrodes which have been illustrated. The concave end 25 of the anode 24 makes it possible to place the resonator device very close thereto. The inside diameter of the anode 24 is substantially the same size as the diameter of wafer 12, so that the glow is localized on the electrodes 14, 15 and 16.

The piezoelectric device 11 can be supported on any standard socket, as when it is actually used in electronic apparatus. This is illustrated schematically in FIG. 1 by an insulator 30 having sockets 32 therein for receiving conductors 34, 35 and 36 connected to electrode 14, 15 and 16, respectively, and conductors 38 which are connected to electrodes 13 which are opposite the electrodes 14, 15 and 16 on the wafer 12. Connections are provided to the sockets 32 engaged by conductors 38 to complete the circuits from the electrodes 13 through by-pass capacitors 39 to ground. The circuit from electrode 14 extends through conductor 34 and through resistor 40 and switch 41 to a bias potential provided by potentiometer 42. Similarly, circuits are provided from electrodes 15 and 16 through resistors 46 and 47 and switches 48 and 49 to potentiometers 50 and 51. The potentiometers 42, 50 and 51 are all connected to a terminal 44 to which a potential of the order of +50 volts applied. The leads 34, 35 and 36 from the electrodes 14, 15 and 16 are also connected through D.C. blocking capacitors 52 to a frequency measuring device 54.

To provide the anodization action, the gun 10 and resonator device 11 are placed in a dry oxygen atmosphere at approximately 1.7 Torr. The chamber about the gun 10 and resonator device 11 is schematically represented by the dotted lines 29 together with the base 28 and insulator 30. The anode 24 of the glow gun 10 can be grounded through post 26 connected thereto, and the cathode 20 can be connected to a negative potential through post 23. The posts 23 and 26 can also form supports for the gun, as will be further explained. The potential applied between the anode 24 and the cathode 20 will produce a glow current of the order of 0.25 to 2.0 milliamps. This produces plasma flow between the screen 21 and the face 25 of the anode 24, so that the plasma is localized on the electrodes 14, 15 and 16 of the resonator device 11.

The extent of the anodization of the electrodes 14, 15 and 16 is selectively controlled by the selective application of potentials thereto through the switches 41, 48 and 49 and potentiometers 42, 50 and 51. Anodization depths of the order of 400 Angstroms, with a resolution of ±1 Angstrom, can be obtained, because the process is very uniform and stable. As no anodization takes place when an electrode is not connected in a return circuit, the electrodes can be anodized to different extents. A positive potential of the order of 50 volts is applied to terminal 44, and the potentiometers 42, 50 and 51 can be set to apply a portion of this potential, such as 30 volts (for example), to the electrodes. The penetration of the anodization of each electrode depends on the potential applied, and the length of time the electrode is connected.

The electrodes 14, 15 and 16 of the resonator device 11 are connected to a frequency measuring device 54, which may be of known construction. The electrodes can be connected to separate measuring circuits, or connected in turn to a single measuring circuit. The measuring circuits are completed from the resonator device 11 to ground through the capacitors 39 which are connected to the electrodes 13. As is well known, a monolithic crystal filter includes a plurality of sections which are acoustically coupled through the wafer, and the overall response of the filter depends upon the individual responses of the sections. By measuring the responses and selectively controlling the potentials applied to the electrodes, each of the electrodes can be anodized to the depth required to provide the desired response. As the anodization takes place in a dry vacuum, measurements are accurate, and can be taken continuously, if desired.

Details of the structure of the oxygen glow gun 10 are shown in FIGS. 2 to 5. FIG. 2 is a plan view of the anode 24 looking at the concave face 25, and FIG. 3 is a cross-section view along the lines 3—3 of FIG. 2. FIG. 2 shows a specific form of the connecting and mounting post 26 and the insulating sleeve 60 coupled thereto. The sleeve 60 is formed of a plastic insulating material, such as Delrin, and has internal threads engaging threads on the post 26. A connector tip 62 within sleeve 60 has a pointed end 63 mating with a recess in the post 26 and held thereagainst by spring 64. The connector tip 62 has a recess 65 for receiving a conductor 66 for making an electrical connection through the tip 62 and post 26 to the anode 24. As previously stated, the anode 24 can be formed of aluminum, and the inner surface 27 and face 25 thereof are conductive to form the active anode surfaces. The remaining surfaces of the anode can be anodized to render the same insulating. The glow region is confined to the interior of the gun 10, and directly adjacent to the concave face 25 of the anode 24.

FIG. 4 is a cross-section view of the insulator 22 which is positioned between the anode 24 and cathode 20. All the surfaces of this aluminum ring 22 are anodized so that it forms an insulator. The surface adjacent to the cathode 20 has an annular projection 31 which engages the cathode screen 21, as shown by FIG. 1.

FIG. 5 shows the cathode 20 of the glow gun 10 and shows post 23 for supporting and connecting the same. This post may be identical to post 26 connected to the anode 24, and an insulating sleeve identical to sleeve 60 and a connector tip identical to connector tip 62 (FIG. 2) can be used therewith. The cathode 20 has a recess 19 for receiving the screen 21, which may be a fine mesh stainless steel screen. The projection 31 on insulator 22 engages screen 21 and extends into recess 19 to hold the screen 21 in place. The inside surface 18 of cathode 20, and the recess 19 thereof, are conductive to provide a current path to the screen 21, and the remainder of the cathode 20 can be anodized. Openings 17 are provided in the closed end of cathode 20 for the flow of oxygen therethrough.

Where potentials are applied to the glow gun 10 as shown in FIG. 1, a glow region is established from the screen 21 to the concave face 25 of the anode. This region may be of the order of 20 millimeters long and 20 millimeters in diameter. The overall length of the gun 10 can be less than 50 millimeters. This forms a small, low energy, oxygen glow device which localizes the oxygen plasma at the face 25 of the anode 24, so that it can be directed on the electrodes of the resonator device 11. The gun 10 produces a very small amount of heat so that it does not damage the resonator, or impede the monitoring of the frequency characteristics thereof.

It will be apparent that the measurements obtained by the measurement device 54 may be used to control the individual anodization of the electrodes of the resonator device 11 in different known ways. For example, an operator can observe the measurements and control the switches 41, 48 and 49, and the settings of potentiometers 42, 50 and 51 to produce the desired action. Also, a general purpose computer can be used to receive the measurements and activate the controls in accordance with a preset pattern.

The process which has been described has been found to be highly successful for adjusting the frequency responds of a multi-section piezoelectric resonator, such as a monolithic crystal filter. As the response can be continuously monitored, and the anodization of the electrodes can be individually controlled, very accurate adjustment can be easily accomplished. The process utilizes low energy plasma so that there is substantially no danger of damage to the resonator device which is being adjusted.

What is claimed is:

1. The method of adjusting the frequency response of a piezoelectric resonator device which includes a piezoelectric wafer with a plurality of resonating sections each having an anodizable electrode thereon, and with such electrodes of a plurality of sections being positioned adjacent to each other;

such method including the steps of:
applying oxygen plasma to the adjacent electrodes,
selectively applying direct current potentials to the individual electrodes to cause anodization thereof, and
measuring the frequency response of the resonator device during such anodization of the electrodes.

2. The method of claim 1 wherein the value of the potential applied to each electrode and the duration of such application is controlled, to thereby control the anodization of the individual electrodes.

3. The method of claim 1 wherein the plasma is applied to the electrodes in a dry vacuum atmosphere, and the plasma is confined to the region adjacent the electrodes.

4. The method of adjusting the frequency response of a monolithic crystal filter which includes a quartz resonator plate with a plurality of aluminum electrodes on one side thereof;

such method including the steps of:
producing low energy oxygen plasma,
applying the plasma to a localized area including the aluminum electrodes,
selectively connecting such electrodes in a circuit to cause selective anodization of the aluminum electrodes, and
measuring the change in frequency response of the resonator during the anodization action.

5. The method of claim 4 including the further step of controlling the connection of the electrodes in the circuit in response to frequency response measurements to thereby control the anodization of the individual electrodes and provide the desired frequency response.

6. The method of claim 4 wherein the plasma is applied to the electrodes in an environment free of materials which might contaminate the filter.

7. Apparatus for adjusting the frequency response of a piezoelectric resonator device which includes a piezoelectric wafer with a plurality of resonating sections each having an anodizable electrode, and with such electrodes of a plurality of sections being positioned adjacent to each other, including in combination:

a low energy oxygen glow device for producing low energy plasma including anode and cathode rings insulated from each other, said anode ring having an inner diameter of generally the same size as the resonator device,
means for supporting the device adjacent said anode ring, and
means for connecting to the electrodes of the resonator for applying potentials thereto, and for measuring the frequency response thereof.

8. Apparatus in accordance with claim 7 wherein said anode has a concave face for directing plasma in a localized area including the electrodes.

9. Apparatus in accordance with claim 8 wherein said glow device has a conducting screen positioned across said cathode and cooperating with said anode to define a glow region.

10. Apparatus in accordance with claim 9 wherein the glow region extends within said glow device from said screen to said concave face of said anode.

* * * * *